United States Patent [19]

Cabot

[11] Patent Number: 4,546,270
[45] Date of Patent: Oct. 8, 1985

[54] SAMPLE AND HOLD DROOP COMPENSATION CIRCUIT

[75] Inventor: Richard C. Cabot, Beaverton, Oreg.

[73] Assignee: Tektronix, Inc., Beaverton, Oreg.

[21] Appl. No.: 537,468

[22] Filed: Sep. 29, 1983

[51] Int. Cl.[4] ............................................. G11C 27/02
[52] U.S. Cl. .................................. 307/353; 307/310; 328/151
[58] Field of Search ...................... 307/262, 353, 310; 328/151, 162, 172, 173, 175

[56] References Cited

U.S. PATENT DOCUMENTS

| | | | |
|---|---|---|---|
| 3,480,795 | 11/1969 | Benson et al. | 307/353 |
| 3,516,002 | 6/1970 | Hillis | 307/353 |
| 4,352,070 | 9/1982 | Beauducel et al. | 328/151 |

*Primary Examiner*—John Zazworsky
*Attorney, Agent, or Firm*—William A. Birdwell

[57] ABSTRACT

A circuit for use in association with a sample and hold circuit for preventing a sampled signal voltage from changing with time. The storage capacitor port at the sample and hold circuit is connected through a resistor to a variable voltage divider so that by adjusting the tap of the divider the current through the resistor can be adjusted to match the bias current generated at the capacitor port by the sample and hold circuit. A temperature sensitive device is included in the voltage divider for varying tap voltage and, hence, the matching current with ambient temperature to compensate for corresponding changes in bias current. The voltage divider is connected between the sample and hold output and a common return path to ensure that the voltage at the tap is a function of the sampled voltage and the temperature only.

9 Claims, 3 Drawing Figures

U.S. Patent  Oct. 8, 1985  4,546,270
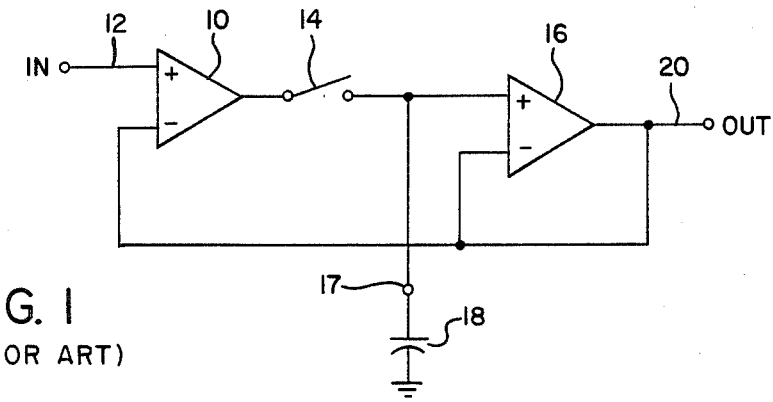
FIG. 1
(PRIOR ART)
FIG. 2
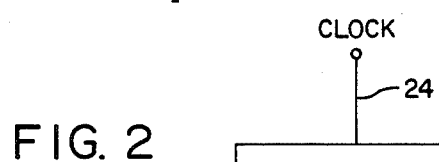
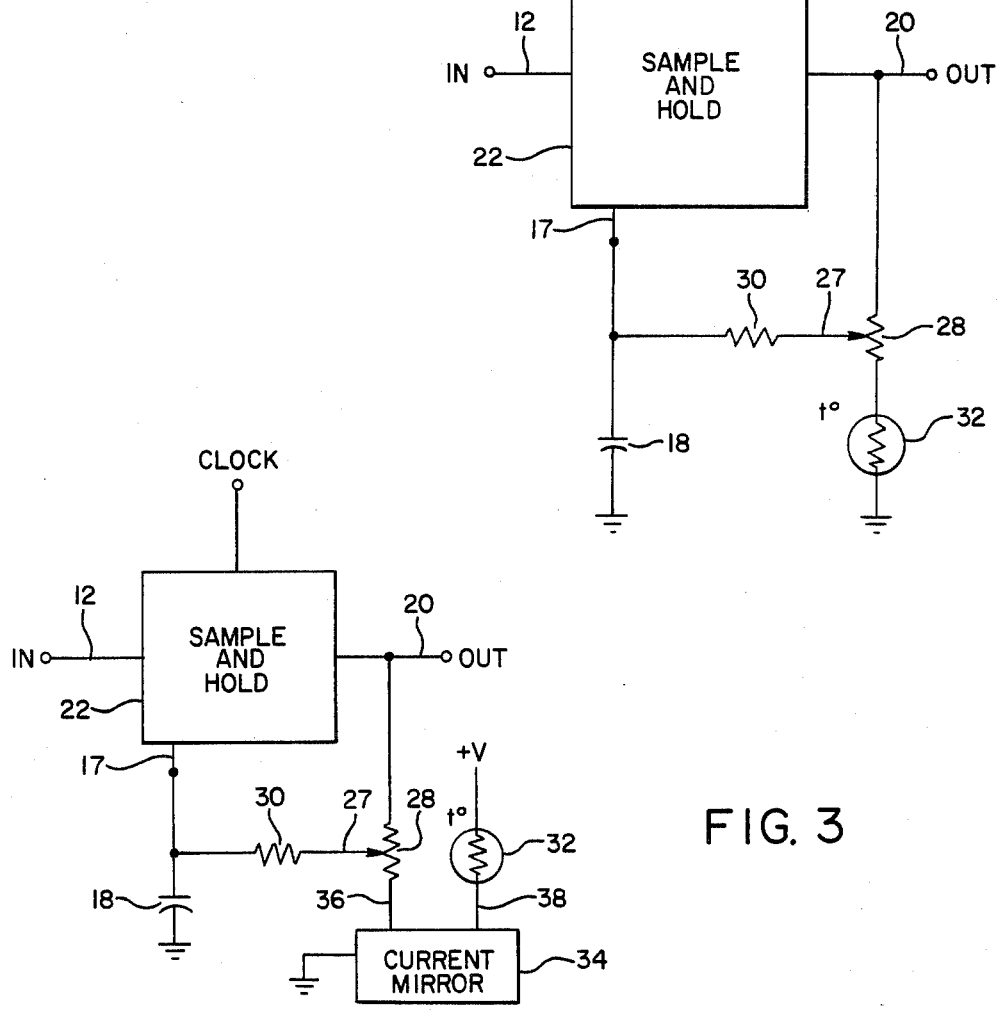
FIG. 3

SAMPLE AND HOLD DROOP COMPENSATION CIRCUIT

BACKGROUND OF THE INVENTION

This invention relates to circuitry associated with a sample and hold circuit, particularly to a droop compensation circuit for preventing a sampled signal voltage from changing with time.

Sample and hold circuits which momentarily connect a capacitor to a signal, typically through an amplifier, until the capacitor is charged to the level of that signal and thereafter disconnect the capacitor to store that level by retaining the charge on the capacitor are commonly known and used in many applications. One problem encountered with such circuits is that over a period of time the charge of the capacitor increases or decreases as a result of its being used to provide the sampled level to a subsequent device. Typically the capacitor is connected to the input of a buffer, output amplifier whose bias current charges or discharges the capacitor, depending upon the type of amplifier device. Consequently, the sampled voltage tends to change or "droop".

One application in which such sample and hold circuits are used is in association with an oscillator to sample the oscillator output signal and employ that sample to control the oscillator amplitude. If the voltage across the storage capacitor is allowed to change then the voltage appearing at the sample and hold circuit output will be different from the actual sampled voltage by an amount equal to the magnitude of the change in voltage. At low frequencies, for example, about 10 hertz, there is a significant time delay between successive oscillator cycles, so the droop effect may become pronounced toward the end of each cycle. This produces a sawtooth waveform which, when superimposed on the oscillator sine wave output, shows up as ripple distortion in the oscillator output waveform.

Accordingly, it is desirable to employ circuitry associated with the sample and hold circuit to prevent droop from occurring.

SUMMARY OF THE INVENTION

The present invention solves the aforementioned problem for sample and hold circuits employing a buffer, output amplifier by providing an alternative current path to the amplifier input through which a selectable amount of current is allowed to flow so that charge is neither drained from nor added to the storage capacitor by bias current from the buffer amplifier that it drives. This is accomplished by connecting one terminal of a relatively high value resistor to the capacitor-amplifier input node of the sample and hold circuit and the other terminal to the tap of a variable, resistive voltage divider, the divider being connected between the sample and hold output and common return. By varying the voltage divider, the amount of current through the alternative path can be adjusted to prevent current flow to or from the capacitor.

Since the bias current of the buffer amplifier changes with changes in temperature the droop circuit includes a temperature compensation device for varying the current through the voltage divider with temperature, which varies the voltage at the divider tap and, hence, the current through the alternative path.

Where the output level of the sample and hold circuit is unpredictable, the temperature compensation device comprises a controllable constant current source controlled by a temperature sensitive device.

It is therefore a principal objective to provide a novel circuit for eliminating unwanted voltage level changes in the output of a sample and hold circuit.

It is a further objective of the present invention to provide such a circuit which provides an alternative current path to the input of a sample and hold circuit buffer amplifier through which an amount of current is allowed to flow equal to the amplifier bias current so that any change in voltage across the sample storage capacitor is substantially prevented.

It is a further objective of the present invention to provide such a circuit which prevents unwanted voltage changes at the output of a sample and hold circuit despite the unpredictability of the sample signal level.

The foregoing and other objectives, features and advantages of the invention will be more readily understood upon consideration of the following detailed description of the invention, taken in conjunction with the accompanying drawings.

BRIEF DESCRIPTION OF THE DRAWINGS

FIG. 1 shows a simplified schematic diagram of a typical prior art sample and hold circuit.

FIG. 2 shows a first embodiment of a sample and hold droop compensation circuit according to the principles of the present invention associated with a sample and hold circuit.

FIG. 3 shows a schematic diagram of a second embodiment of a sample and hold droop compensation circuit according to the principles of the present invention associated with a sample and hold circuit.

DETAILED DESCRIPTION OF THE INVENTION

Referring to FIG. 1, a typical sample and hold circuit has a first amplifier 10 which receives at a non-inverting input 12 a signal to be sampled. The output of the amplifier 10 is connected by an electronically controlled switch 14 periodically turned on and off by a clock signal. The switch is typically connected internally to a non-inverting input of a second, buffer amplifier 16 and through a port 17 to an external sample storage capacitor 18. The output 20 of the second amplifier provides the sample and hold circuit output and is fed back to non-inverting inputs of both the first and second amplifiers.

In such a circuit when the switch 14 is closed and first amplifier 10 charges the capacitor 18 for a predetermined period of time to the level of the sampled portion of the signal at input 12, the amplifiers 10 and 16 having unity gain. Amplifier 16 provides a high impedance input for the capacitor 18, thereby minimizing its rate of discharge, while providing a voltage at output 20 equal to the voltage across the capacitor 18. However, a small amount of bias current is generated by amplifier 16 at its input, which causes the storage capacitor to charge or discharge, depending upon the direction of the bias current, thereby causing the voltage at the output 20 to change. The direction of bias current depends upon the type of device employed in the input circuit of the buffer amplifier.

Turning now to FIG. 2, a conventional sample and hold circuit of the type shown in FIG. 1 is represented by the circuit block 22, which may be, for example, an LF 398 sample and hold circuit manufactured by National Semiconductor Corporation. The sampling clock signal is supplied at port 24 and the external capacitor 18 is connected to a storage capacitor port 17. In order to divert buffer amplifier bias current from the storage capacitor, a resistor 30 is connected between the port 17 and the tap 27 of a variable voltage divider comprising a variable resistor 28, ordinarily a potentiometer, and a temperature compensator device. By varying the setting of the potentiometer the voltage across the resistor 30 and, hence, the current through it, can be adjusted to match the bias current.

Since the amount of bias current generated by the sample and hold buffer amplifier varies with ambient temperature, typically increasing with increasing temperature, and vice versa, one end of the resistor 28 is connected to a temperature compensation device for varying the current through resistor 28 with ambient temperature, in the same direction as the bias current change. The change in current through resistor 28 changes the voltage at the voltage divider tap and, hence, the current through the resistor 30, such that the current through resistor 30 continues to match the bias current. The resistance of the potentiometer 28 is much lower than the resistance of resistor 30 so that the relatively small current through resistor 30 can be controlled by a practical temperature compensation device operating at a relatively higher current.

In the simplest case, shown in FIG. 1, the temperature compensation function may be performed by a thermistor 32 which has a negative temperature coefficient such that as its temperature increases its resistance decreases. Such a device will work adequately if the output 20 of the sample and hold circuit is known, as in an oscillator control circuit where the oscillator output is being sampled in order to control its amplitude at a predetermined level; while the amount of droop will vary if the voltage at output 20 is not the predicted amount, that is ordinarily not important since the signal will not be satisfactory until the control loop returns its amplitude to the predetermined level. In any case, connection of the voltage divider to the output of the sample and hold circuit ensures that the voltage at the tap will not vary independently from the sampled signal voltage and temperature.

Referring now to FIG. 3, where the voltage at the output 20 of the sample and hold circuit is unpredictable, the droop compensation can nevertheless be accomplished by providing a controllable constant current source such as a current mirror 34 or any other of a variety of commonly known controllable constant current sources. By controlling the amount of current through the resistor 28, without regard to the voltage at the output 20, the current through resistor 30 will remain equal to the bias current drawn by the sample and hold buffer amplifier once adjusted to match. This is because any change in the voltage at output 20, which is equal to the voltage at port 17, will produce an identical change in the voltage at the tap 27 (the voltage at the tap being equal to the output voltage less the product of the current through resistor 28 and the resistance of the potentiometer from the output terminal to the tap) thereby maintaining a constant voltage across the resistor 30.

As is commonly known in the art, the current mirror 34 will produce at a controlled port 36 a current equal to that flowing through a control port 38. With a temperature sensitive resistor such as thermistor 32 connected to control port 38, the droop circuit is thereby temperature compensated. It is recognized that other temperature controlled constant current devices or circuits could be used, including devices having a positive temperature coefficient, without deviating from the principles of the invention.

It should be recognized that while resistor 28 in FIGS. 2 and 3 has been shown to be a potentiometer, which is the most desirable construction due to changes in component characteristics that can occur with time and as a result of changing ambient conditions, the resistor 28 could be replaced by a fixed resistor connected at one terminal to the output 20 and at its other terminal to the resistor 30 and to the temperature compensating device, or by two series resistors, without departing from the principles of the invention.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A droop compensation circuit for use with a sample and hold circuit to prevent unwanted changes in the voltage output of the sample and hold circuit, the sample and hold circuit having a sampled signal input, a sample output, and a storage capacitor port for connection to one terminal of a storage capacitor, the other terminal being connected to a common return path, the storage capacitor port being connected to a non-inverting input of an amplifier whose output provides the sample output, said droop compensation circuit comprising:
    (a) first resistor means connected to said sample output for providing a selected resistance therethrough between said sample output and a first node;
    (b) second resistor means connected between said storage capacitor port and said first node for providing a selected resistance therethrough; and
    (c) temperature compensation means, connected to said first resistor means, for varying the current through said first resistor means between said sample output and said first node with changes in ambient temperature, thereby varying the current flow through said second resistor means.

2. The droop compensation circuit of claim 1 wherein said first resistor means comprises a variable resistor having a first terminal connected to said sample output, a second terminal connected to said temperature compensation means, the resistance between said first and second terminals being fixed, and a third terminal connected at said first node to said second resistor means, said third terminal being connected to means for selectively varying the resistance between said first and third terminals.

3. The droop compensation circuit of claim 2 wherein said first resistor means comprises a potentiometer.

4. The droop compensation circuit of claim 2 wherein said temperature compensation means comprises a thermistor connected from said second terminal of said first resistor means to said common return path.

5. The droop compensation circuit of claim 2 wherein said temperature compensation means comprises a controllable constant current source means connected between said first resistor means and said common return path for generating a current therethrough between said first resistor means and said common return path, the current generated thereby being controlled so as to vary with, and in the same direction as, changing ambient temperature.

6. The droop compensation circuit of claim 5 wherein said constant current source is a current mirror having a control port and a controlled port, the controlled port being connected to said second terminal of said first resistor means and providing current in proportion to the current through said control port, and said compensation circuit further comprises a thermistor connected between a constant voltage source and said control port.

7. The droop compensation circuit of claim 1 wherein said temperature compensation means comprises a thermistor connected from said first resistor means to said common return path.

8. The droop compensation circuit of claim 1 wherein said temperature compensation means comprises a controllable constant current source means connected between said first resistor means and said common return path for generating current therethrough between said first resistor means and said common return path, the current generated thereby being controlled so as to vary with, and in the same direction as, changing ambient temperature.

9. The droop compensation circuit of claim 8 wherein said constant current source is connected to a thermistor for control of the current generated thereby.

* * * * *